(12) United States Patent
Mantese et al.

(10) Patent No.: US 9,599,637 B2
(45) Date of Patent: Mar. 21, 2017

(54) APPARATUS AND METHOD FOR FACILITATING TRANSMISSION OF A WIRELESS SIGNAL FROM EMBEDDED SENSORS

(71) Applicant: UNITED TECHNOLOGIES CORPORATION, Hartford, CT (US)

(72) Inventors: Joseph V. Mantese, Ellington, CT (US); Nicholas Charles Soldner, Southbury, CT (US); Michael A. Klecka, Vernon, CT (US); Daniel V. Viens, Mansfield, CT (US)

(73) Assignee: United Technologies Corporation, Hartford, CT (US)

( * ) Notice: Subject to any disclaimer, the term of this patent is extended or adjusted under 35 U.S.C. 154(b) by 199 days.

(21) Appl. No.: 14/643,734

(22) Filed: Mar. 10, 2015

(65) Prior Publication Data

US 2015/0285837 A1  Oct. 8, 2015

Related U.S. Application Data

(60) Provisional application No. 61/974,581, filed on Apr. 3, 2014.

(51) Int. Cl.
*G01R 1/04* (2006.01)
*C23C 24/04* (2006.01)
(Continued)

(52) U.S. Cl.
CPC .................. *G01R 1/04* (2013.01); *C23C 4/08* (2013.01); *C23C 24/04* (2013.01); *G01D 11/245* (2013.01);
(Continued)

(58) Field of Classification Search
CPC .... G01R 1/04; G01R 3/00; G01R 1/18; C23C 24/04; C23C 4/08; G01D 11/245; G01D 21/00; Y10T 29/49016
(Continued)

(56) References Cited

U.S. PATENT DOCUMENTS 7,146,861 B1  12/2006  Cook et al.
7,353,711 B2   4/2008  O'Dowd et al.
(Continued)

OTHER PUBLICATIONS

Extended European Search Report dated Aug. 12, 2015 in European Application No. 15160907.0.

*Primary Examiner* — Billy Lactaoen
(74) *Attorney, Agent, or Firm* — Snell & Wilmer L.L.P.

(57) ABSTRACT

An embedded sensor apparatus for enabling wireless signal transmission while protecting an embedded sensor is disclosed. In various embodiments, an embedded sensor apparatus may comprise a substrate with a cavity, a wireless sensor embedded in the cavity of the substrate, a protective cover coupled to the wireless sensor, and a ferrite layer covering the protective cover. Further, the embedded sensor apparatus may comprise an electromagnetic reflector coupled between the wireless sensor and the substrate. In addition, the ferrite layer may be a ferrite plug, a deposited ferrite layer, or a combination thereof. Furthermore, in various embodiments, covering the protective cover with the ferrite layer may comprise depositing the ferrite layer on the protective cover using a cold spray process. In another embodiment, covering the protective cover with the ferrite layer may comprise depositing the ferrite layer on the protective cover using a thermal spray process.

19 Claims, 5 Drawing Sheets

(51) Int. Cl.
*C23C 4/08* (2016.01)
*G01R 1/18* (2006.01)
*G01R 3/00* (2006.01)
*G01D 11/24* (2006.01)
*G01D 21/00* (2006.01)

(52) U.S. Cl.
CPC ............... *G01D 21/00* (2013.01); *G01R 1/18* (2013.01); *G01R 3/00* (2013.01); *Y10T 29/49016* (2015.01)

(58) Field of Classification Search
USPC ........................................................ 324/612
See application file for complete search history.

(56) References Cited

U.S. PATENT DOCUMENTS

| 2004/0000967 | A1* | 1/2004 | Bodley | H01P 1/215 |
| | | | | 333/185 |
| 2007/0281102 | A1* | 12/2007 | Hailey | B03C 1/0332 |
| | | | | 427/421.1 |
| 2008/0204275 | A1* | 8/2008 | Wavering | H04Q 9/00 |
| | | | | 340/870.16 |
| 2009/0007679 | A1* | 1/2009 | Nunez | G01L 9/0072 |
| | | | | 73/715 |
| 2010/0155098 | A1* | 6/2010 | Sun | G01D 9/005 |
| | | | | 174/50.51 |

* cited by examiner

APPARATUS AND METHOD FOR FACILITATING TRANSMISSION OF A WIRELESS SIGNAL FROM EMBEDDED SENSORS

CROSS-REFERENCE TO RELATED APPLICATIONS

This application is a nonprovisional of, and claims priority to, and the benefit of U.S. Provisional application No. 61/974,581, entitled "APPARATUS AND METHOD FOR FACILITATING TRANSMISSION OF A WIRELESS SIGNAL FROM EMBEDDED SENSORS," filed on Apr. 3, 2014, which is hereby incorporated by reference in its entirety.

FIELD

The present disclosure relates to surface preparation of structural components for embedding of sensors, specifically for facilitating transmission of a wireless signal from an embedded wireless sensor.

BACKGROUND

Wireless sensors may be used to provide a variety of information, and in a variety of environments. However, it may be difficult or impossible to read a sensor embedded in metallic or highly conductive components such as aircraft skins or turbine blades. Even the thinnest conductive surfaces may create eddy-currents that prevent significant electromagnetic field penetration, thus impeding the ability to read an embedded sensor.

SUMMARY

An embedded sensor apparatus for enabling wireless signal transmission while protecting an embedded sensor is disclosed. In various embodiments, an embedded sensor apparatus may comprise a substrate with a cavity, a wireless sensor embedded in the cavity of the substrate, a protective cover coupled to the wireless sensor, a high resistivity metal-ceramic composite and/or a ferrite layer covering the protective cover. Further, the embedded sensor apparatus may comprise an electromagnetic reflector coupled between the wireless sensor and the substrate. In addition, the ferrite layer may be a ferrite plug, a deposited ferrite layer, a metal-ferrite composite, or a combination thereof. In various embodiments, the ferrite layer may comprise a mixture of ferrite powder and metal powder, which may be deposited using a cold spray system or a thermal spray system. In various embodiments, a material of the ferrite powder is selected based in part on an operating frequency of the wireless sensor. The cavity of the substrate may be shaped to generate directional tuning of the wireless sensor. For instance, the cavity of the substrate may be "E" shaped. According to various embodiments, the wireless sensor is a radio frequency (RF) sensor. Also, the embedded sensor apparatus may be a moving component.

Moreover, in various embodiments, a method of facilitating transmission of a wireless signal from an embedded wireless sensor may comprise embedding the wireless sensor in a cavity of a substrate, coupling a protective cover to the wireless sensor, and covering the protective cover with a ferrite layer and/or a high resistivity metal-ceramic composite. In various embodiments, the ferrite layer may be a ferrite plug, a deposited ferrite layer, a metal-ferrite composite, or a combination thereof. Furthermore, in one embodiment, covering the protective cover with the ferrite layer may comprise depositing the ferrite layer on the protective cover using a cold spray process. In another embodiment, covering the protective cover with the ferrite layer may comprise depositing the ferrite layer on the protective cover using a thermal spray process. In another embodiment, the thermal spray process comprises a plasma spray process applying arcing and heat, and locally melting a mixture of ferrite powder and metal powder. In another embodiment, the thermal spray process comprises a twin wire arc process applying arcing and locally melting a mixture of ferrite powder and metal powder. In another embodiment, the thermal spray process may comprise a high velocity oxy-fuel coating spraying (HVOF) process comprising: melting a mixture of ferrite powder and metal powder using combustion to from a molten mixture, and blowing the molten mixture onto the substrate.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, electrical, and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected, coupled or the like may include permanent, removable, temporary, partial, full and/or any other possible attachment option. Additionally, any reference to without contact (or similar phrases) may also include reduced contact or minimal contact.

Transmission of signals from a wireless sensor in an embedded sensor apparatus may be impeded by a surrounding environment, especially if the embedded sensor apparatus contains a conductive member such as metal. However, signal transmissions may be enhanced by transmitting the wireless signals through a material having low coercivity, low permeability, and high electrical resistance. Moreover, embedding wireless sensors into structural components for in-situ wear and status monitoring may improve condition-based-maintenance and enable adaptive fault tolerant systems. The embedded wireless sensors may measure the integrity, temperature, acceleration or other properties of a structure.

Embedded sensors for in-situ monitoring may be applicable in many industries, including material processing and refinement, and the manufacture and utilization by the transportation and aerospace industries. Moving components are likely to benefit from using embedded sensors rather than surface mounted sensors. The benefit may be due to space or assembly issues, non-degraded dynamic movement, or the ability to secure the sensor in place while undergoing various loads and forces. Examples of possible applications include adjustable blades in a turbine, test engines, and field operations. Embedded sensors may also be useful in applications having corrosive environments, as the embedded sensors would be protected. Specifically, those areas where high salinity, pH extremes such as acidic or basic environments, and atmospheric conditions which are highly corrosive (e.g., a moist, chlorinated environment). In various embodiments, the sensors may be used to measure vibration, position, temperature, speed, pressure, strain, chemical environment and like.

Figure 1:
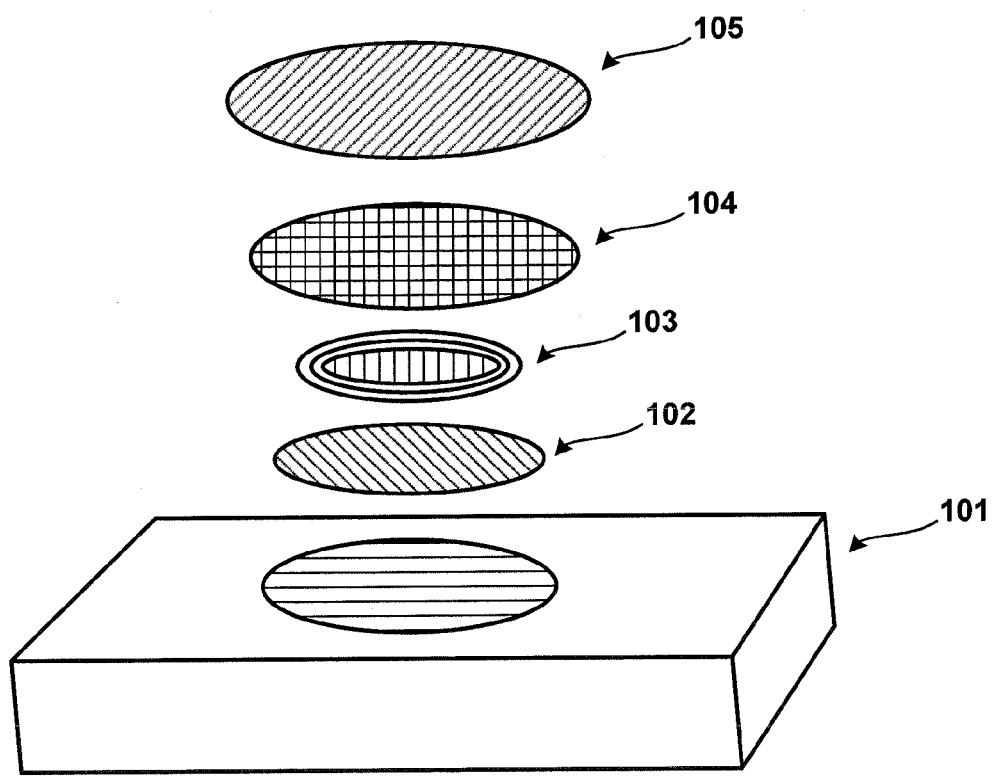
FIG. 1 illustrates, in accordance with various embodiments, an exploded view of an embedded sensor apparatus.

One aspect of facilitating the embedded sensors is creating a non-invasive surface preparation that allows electromagnetic fields to interface with an embedded sensor placed in a conductive element. In accordance with various embodiments, a surface preparation method may allow electromagnetic fields to penetrate the surface of an embedded sensor apparatus having a wireless sensor embedded below its surface. The wireless sensor may be a radio frequency (RF) sensor, for example. The surface preparation method may guide and allow penetration of electromagnetic fields to facilitate interaction with the embedded wireless sensor. In various embodiments and with reference to FIG. 1, an embedded sensor apparatus 100 may comprise a substrate 101 with a cavity 102, a wireless sensor 103 embedded in the cavity 102 of the substrate 101, a protective cover 104 coupled to the wireless sensor 103, and a ferrite layer 105 of non-conductive ferrimagnetic ceramic compounds having, for example, iron III oxide, covering the protective cover 104. In various embodiments, the substrate 101 may act as a mounting surface for the embedded wireless sensor 103. In another embodiment, an electromagnetic reflector 106 may be coupled between the wireless sensor 103 and the substrate 101. Electromagnetic reflectors include: nickel foils, nickel iron alloys such as mu-metal®, thin, amorphous metal alloys such as metglas®, and other metal and ceramic materials typically having magnetic permeabilities greater than 10. In yet another embodiment, an additional ferrite layer (not shown) may be coupled between the wireless sensor 103 and the substrate 101. Moreover, in various embodiments, a thin metallic, ceramic, or composite layer (not shown) may be attached above the ferrite layer 105 so that the presence of the embedded wireless sensor 103 is not visible. As used herein, the term "ferrite layer" may refer to any ferrite containing structure.

The size of the wireless sensor 103 and the corresponding size of the cavity 102 are not limited, and commercially available wireless sensors may be used in the various embodiments. Additionally, in various embodiments, selection of the wireless sensor 103 may be dependent on the size and desired power of the sensor apparatus and the depth of the cavity 102. In one example, the cavity depth is approximately ½ inch (1.27 cm) or less from the surface of the sensor apparatus 100. Though typically the cavity 102 may be circular, in various embodiments, the cavity 102 may have specifically designed shapes to generate directional tuning of the wireless sensor 103. For example, the cavity 102 of the substrate 101 may be a "P" or "E"-shaped cavity insert oriented normal to the substrate 101 with "legs" vertical.

The protective cover 104 fits within the cavity 102 and protects the wireless sensor 103. In various embodiments, the protective cover 104 is typically a metal material, ceramic, or composite which may or may not be the same material as the substrate 101. The substrate 101 may be metal, ceramic, glass, or other similar material. Furthermore, in various embodiments, the surface preparation method may include slightly roughing up the protective cover 104 for adhesion of the ferrite layer 105.

In accordance with various embodiments, the ferrite layer 105 may be comprised of ferrite materials of variable porosity to control the permittivity and the resistivity of the material. Soft ferrite compounds are used in various embodiments given their low coercivity (providing easy electromagnetic field redirection), high permeability, and high resistance (providing eddy current reduction). In various embodiments, the ferrite material may be selected based in part on an operating frequency of the wireless sensor 103. The operating frequency of the wireless sensor 103 may be from 125 kHz to 13.56 MHz and above, as an example, though other operating frequencies are contemplated. For example, the ferrite layer 105 may be comprised of nickel-zinc (NiZn) or manganese-zinc (MnZn). NiZn ferrites have low permeability and may be effectively used at frequencies of 2 MHz and above. In contrast, MnZn ferrites have high permeability and may be effectively used at frequencies of 5 MHz and below. In various embodiments, fine nanoparticles (<<1 μm) of metal can be used if embedded in a high resistivity ceramic such as alumina, silicon dioxide, or silicon nitride. In addition, other soft ferrite materials with low coercivity and high resistivity may be used. These include the barium ferrites, the yttrium iron garnets, as well as the metal-ceramic composites.

Figure 2:
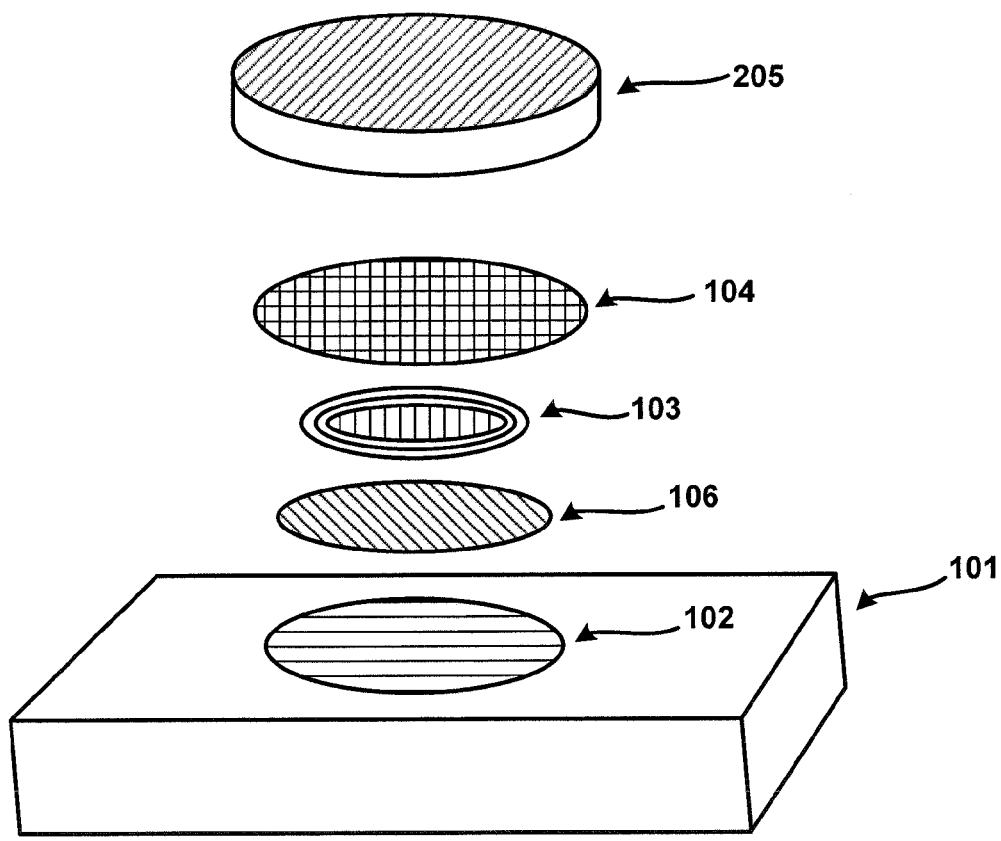
FIG. 2 illustrates, in accordance with various embodiments, an exploded view of an embedded sensor apparatus comprising a ferrite plug.

The ferrite layer may be applied to the embedded sensor apparatus in a variety of ways, including in the form of a plug or as a deposited layer. In accordance with various embodiments and with reference to FIG. 2, an embedded sensor apparatus 200 is similar to embedded sensor apparatus 100 as previously described, except that the ferrite layer is a ferrite plug 205. The ferrite plug 205 may be in the shape of the cavity 102, an E or P core, and then pressed into place over the protective cover 104 using a press-fit method. Ferrite plug embodiments may be useful in applications where the embedded sensor apparatus 200 undergoes minimal loads. Furthermore, in various embodiments, the ferrite plug 205 may be combined with other methods, such as depositing a separate ferrite layer over the top of the ferrite plug 205. Methods and benefits of depositing a ferrite layer on the apparatus will be described in greater detail herein. In addition, in various embodiments, the ferrite plug 205 may be further secured to the apparatus 200 by a securing metal cover (not shown) over the top of the ferrite plug 205. The thickness of the securing metal cover may be designed to not impede the wireless signals from the wireless sensor 103.

Figure 3:
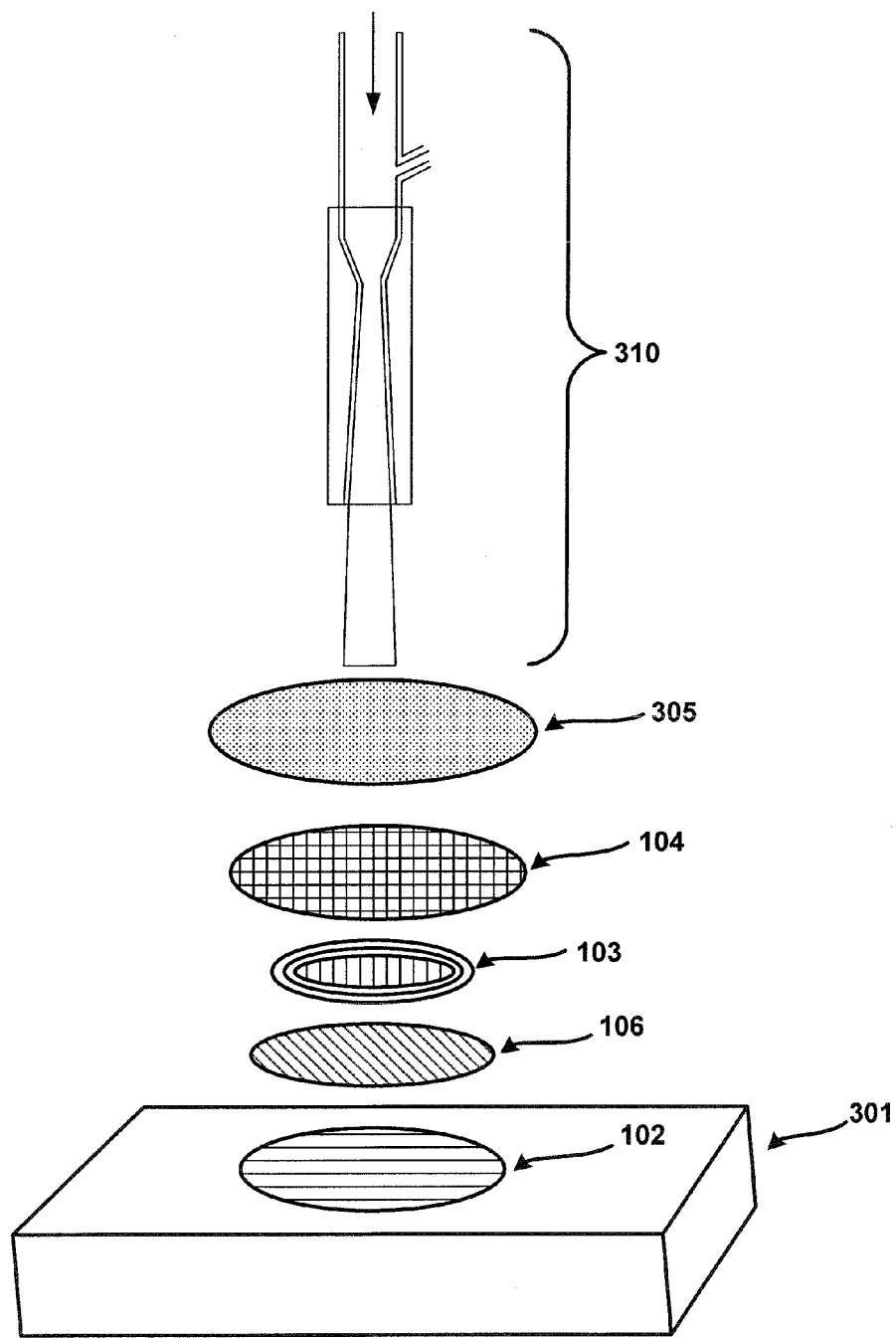
FIG. 3 illustrates, in accordance with various embodiments, an exploded view of an embedded sensor apparatus comprising deposited ferrite layer using a cold spray system.

As previously mentioned, the ferrite layer may also be deposited onto the protective cover and apparatus. Two types of deposition include a cold spray of a ferrite material and a thermal spray of a ferrite material. In accordance with various embodiments and with reference to FIG. 3, a cold spray method of depositing a ferrite layer 305 to an embedded sensor apparatus 300 using a cold spray system 310 may comprise spraying a blend of metal powder and ferrite powder at a temperature below the melting temperature of a substrate 301. For example, the sprayed powder may be 15-20% ferrite materials and remainder may be metal powder. Ferrite percentages may vary from 0 to 75%. Though the cold spray method operates below the melting temperature of the substrate 301, the sprayed powders may still be at a high temperature. For example, the powders may be sprayed at 400° F. (204° C). when being applied to aluminum, which has a melting point of 660° F. (349° C).

Furthermore, in various embodiments, there may be local bonding of the sprayed powder with the mounting surface of the substrate 301 due to the temperature and the high velocity of the sprayed powder application. The temperature of the sprayed powder may be selected based on one or more of the substrate material, the metal powder being deposited, and temperature sensitivity of the wireless sensor.

Figure 4:
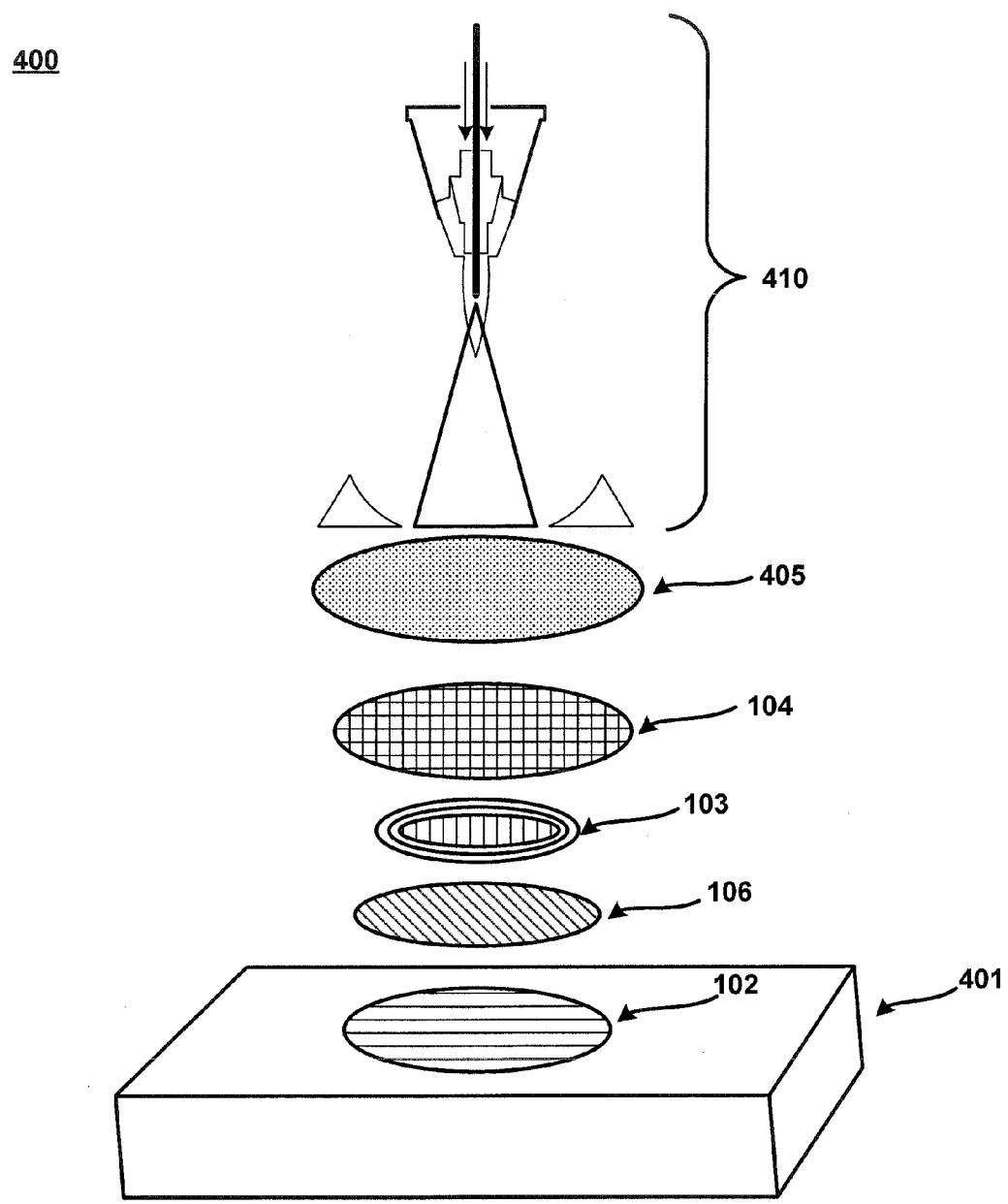
FIG. 4 illustrates, in accordance with various embodiments, an exploded view of an embedded sensor apparatus comprising deposited ferrite layer using a thermal spray system.

In accordance with various embodiments and with reference to FIG. 4, a thermal spray method of depositing a ferrite layer 405 to an embedded sensor apparatus 400 using a thermal spray system 410 may comprise spraying a molten mixture of ferrite and metal materials over the mounting surface of a substrate 401. The thermal spray method may be implemented in embodiments where it may be difficult to bond the spray to the substrate material. For example, bonding may be more difficult if the substrate material is ceramic or glass.

Furthermore, there are different types of thermal spray processes. Some of the different types include a plasma spray process, a twin wire arc process, and a high velocity oxy-fuel coating spraying (HVOF) process. The plasma spray process may include applying arcing and heat, and locally melting the powder mixture. The wire arc process may include arcing and locally melting the powder mixture. The HVOF process may include applying combustion to the powder mixture until melted and then blowing the molten mixture onto the substrate.

Figure 5:
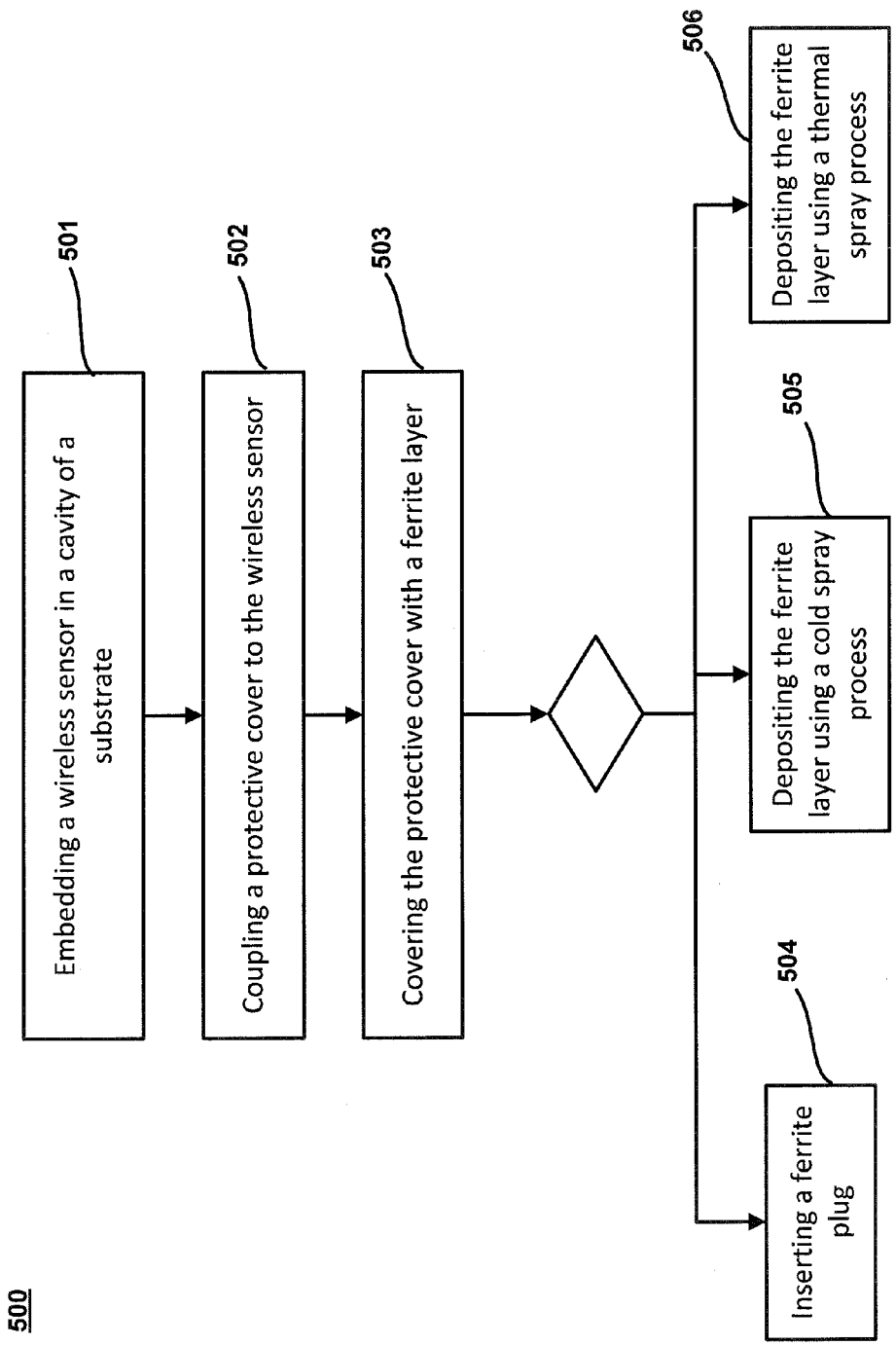
FIG. 5 illustrates, in accordance with various embodiments, an exemplary method of facilitating transmission of a wireless signal from an embedded wireless sensor.

In association with the above-described embodiments, in various embodiments and with reference to FIG. 5, a method of facilitating transmission of a wireless signal from an embedded wireless sensor 500 may comprise embedding the wireless sensor in a cavity of a substrate 501, coupling a protective cover to the wireless sensor 502, and covering the protective cover with a ferrite layer 503. In addition, covering the protective cover with the ferrite layer may comprise at least one of inserting a ferrite plug 504, depositing the ferrite layer on the protective cover using a cold spray process 505, and depositing the ferrite layer on the protective cover using a thermal spray process 506.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An embedded sensor apparatus comprising: a substrate with a cavity; a wireless sensor embedded in the cavity of the substrate; a protective cover coupled to the wireless sensor; and a ferrite layer covering the protective cover, wherein the ferrite layer comprises a ferrite material selected based in part on an operating frequency of the wireless sensor.

2. The embedded sensor apparatus of claim 1, further comprising an electromagnetic reflector coupled between the wireless sensor and the substrate.

3. The embedded sensor apparatus of claim 1, wherein the ferrite layer is a ferrite plug.

4. The embedded sensor apparatus of claim 1, wherein the ferrite layer is a deposited ferrite layer.

5. The embedded sensor apparatus of claim 1, wherein the ferrite layer comprises a ferrite plug and a deposited ferrite layer.

6. The embedded sensor apparatus of claim 1, wherein the ferrite layer comprises a mixture of a ferrite powder and a metal powder.

7. The embedded sensor apparatus of claim 6, wherein a material of the ferrite powder is selected based in part on the operating frequency of the wireless sensor.

8. The embedded sensor apparatus of claim 1, wherein the cavity of the substrate is shaped to generate directional tuning of the wireless sensor.

9. The embedded sensor apparatus of claim 8, wherein the cavity of the substrate is "E"-shaped.

10. The embedded sensor apparatus of claim 1, wherein the wireless sensor is a radio frequency (RF) sensor.

11. The embedded sensor apparatus of claim 1, wherein the embedded sensor apparatus is a moving component.

12. A method of facilitating transmission of a wireless signal from an embedded wireless sensor, the method comprising: embedding the wireless sensor in a cavity of a substrate; coupling a protective cover to the wireless sensor; and covering the protective cover with a ferrite layer, wherein the ferrite layer comprises a ferrite material selected based in part on an operating frequency of the wireless sensor.

13. The method of dam 12, further comprising coupling an electromagnetic reflector between the wireless sensor and the substrate.

14. The method of dam 12, wherein the covering the protective cover with the ferrite layer comprises inserting a ferrite plug.

15. The method of claim 12, wherein the covering the protective cover with the ferrite layer comprises depositing the ferrite layer on the protective using a cold spray process.

16. The method of claim 12, wherein the covering the protective cover with the ferrite layer comprises depositing the ferrite layer on the protective cover using a thermal spray process.

17. The method of dam 16, wherein the thermal spray process comprises a plasma spray process applying arcing and heat, and locally melting a mixture of ferrite powder and metal powder.

18. The method of claim 16, wherein the thermal spray process comprises a twin wire arc process applying arcing and locally melting a mixture of ferrite powder and metal powder.

19. The method of claim 16, wherein the thermal spray process comprises a high velocity oxy-fuel coating spraying (HVOF) process comprising: melting a mixture of ferrite powder and metal powder using combustion to from a molten mixture, and blowing the molten mixture onto the substrate.

* * * * *

UNITED STATES PATENT AND TRADEMARK OFFICE
CERTIFICATE OF CORRECTION

PATENT NO. : 9,599,637 B2  
APPLICATION NO. : 14/643734  
DATED : March 21, 2017  
INVENTOR(S) : Joseph V. Mantese et al.

Page 1 of 1

It is certified that error appears in the above-identified patent and that said Letters Patent is hereby corrected as shown below:

In the Claims

In Column 7, Line 24, please delete "dam" and insert therefor --claim--.

In Column 8, Line 1, please delete "dam" and insert therefor --claim--.

In Column 8, Line 11, please delete "dam" and insert therefor --claim--.

Signed and Sealed this  
Sixteenth Day of May, 2017

Michelle K. Lee  
*Director of the United States Patent and Trademark Office*